United States Patent
Jou et al.

(10) Patent No.: US 8,368,061 B2
(45) Date of Patent: Feb. 5, 2013

(54) ORGANIC LIGHT-EMITTING DIODE EMPLOYING MIXED HOST AND METHOD FOR FABRICATING THE SAME

(75) Inventors: Jwo-Huei Jou, Hsinchu (TW); Sun-Zen Chen, Hsinchu (TW); Shiang-Hau Peng, Hsinchu (TW); Bo-Shian Wu, Hsinchu (TW)

(73) Assignee: National Tsing Hua University, Hsinchu (TW)

( * ) Notice: Subject to any disclaimer, the term of this patent is extended or adjusted under 35 U.S.C. 154(b) by 147 days.

(21) Appl. No.: 13/048,574

(22) Filed: Mar. 15, 2011

(65) Prior Publication Data

US 2012/0049217 A1  Mar. 1, 2012

(30) Foreign Application Priority Data

Aug. 26, 2010  (TW) ................ 99128661 A

(51) Int. Cl.
  *H01L 29/08* (2006.01)
(52) U.S. Cl. .......................... 257/40; 438/99
(58) Field of Classification Search ............ 257/40; 438/99
  See application file for complete search history.

(56) References Cited

U.S. PATENT DOCUMENTS

| | | | | |
|---|---|---|---|---|
| 7,378,161 B2* | 5/2008 | Han et al. | ...................... | 428/690 |
| 7,575,817 B2* | 8/2009 | Lyu et al. | ...................... | 428/690 |
| 7,601,438 B2* | 10/2009 | Ragini et al. | .................. | 428/690 |
| 7,670,691 B2* | 3/2010 | Byun et al. | ..................... | 428/690 |
| 7,998,363 B2* | 8/2011 | Park et al. | ................ | 252/301.16 |
| 2002/0028349 A1* | 3/2002 | Seo | ................................ | 428/690 |
| 2005/0142381 A1* | 6/2005 | Lyu et al. | ...................... | 428/690 |
| 2006/0073358 A1* | 4/2006 | Lyu et al. | ...................... | 428/690 |
| 2006/0078760 A1* | 4/2006 | Ragini et al. | .................. | 428/690 |
| 2007/0026663 A1* | 2/2007 | Okamura | ...................... | 438/620 |
| 2007/0176148 A1* | 8/2007 | Park et al. | ................ | 252/301.16 |
| 2007/0190358 A1* | 8/2007 | Byun et al. | ..................... | 428/690 |
| 2008/0265758 A1* | 10/2008 | Han et al. | ....................... | 313/504 |

\* cited by examiner

*Primary Examiner* — Marc Armand
*Assistant Examiner* — Bilkis Jahan
(74) *Attorney, Agent, or Firm* — Muncy, Geissler, Olds & Lowe, PLLC

(57) ABSTRACT

A method for fabricating an organic light-emitting diode employing a mixed host is disclosed, which comprises the following steps: (A) providing a substrate with a first electrode formed thereon; (B) coating a mold with a light-emitting layer material, wherein the light-emitting layer material comprises: a mixed host, and dye molecule(s) (or dye-function-group-composing materials) etc.; (C) pressing the mold coated with the light-emitting layer material onto the substrate to transfer the light-emitting layer material to the first electrode of the substrate, to form a light-emitting layer; and (D) forming a second electrode over the light-emitting layer. The mixed host consists of host-function molecule(s) and auxiliary additives. In addition, the present invention also provides a light-emitting diode, which is prepared by the aforementioned method.

21 Claims, 5 Drawing Sheets

ORGANIC LIGHT-EMITTING DIODE EMPLOYING MIXED HOST AND METHOD FOR FABRICATING THE SAME

BACKGROUND OF THE INVENTION

1. Field of the Invention

The present invention relates to an organic light-emitting diode employing a mixed host and a method for fabricating the same and, more particularly, to an organic light-emitting diode employing a mixed host formed through an imprinting process and method for fabricating the same.

2. Description of Related Art

Organic light-emitting diodes (OLEDs) have great potential for next generation lighting and displaying devices due to their superb characteristics, such as being ultra-thin in thickness (1 mm or less), high brightness, wide viewing angle (more than 170°), no backlight requirement, low power consumption, rapid response, high resolution, low heat generation, and flexible in appearance. Hence, the OLEDs attract many attentions in both academics and industry.

As shown in FIG. 1, the structure of the conventional OLED comprises: a substrate 101, an anode 102, a hole injection/transport layer 103, a light-emitting layer 104, an electron injection/transport layer 105, and a cathode 106. The light-emitting layer 104 is located between the hole injection/transport layer 103 and the electron injection/transport layer 105, and the function of the light-emitting layer 104 is to generate or control the combination of holes and electrons which result in emissions.

OLEDs can be roughly divided into polymer-type OLEDs and molecule-type OLEDs, according to the employing host materials. The polymer-type OLEDs is generally prepared through a wet spin-coating process. Although the polymer-type OLEDs with good efficiency can be prepared through the spin-coating process, this method can be hardly used to prepare patterned polymer-type OLEDs. Hence, some researchers have developed new techniques to patterned polymer-type OLEDs i.e. contact printing process or roll-to-roll printing process etc. However, the obtained devices mostly show low efficiency and low brightness. For fabricating molecule-type OLEDs, it is generally using a vacuum evaporation process to prepare a pixel-composing one. Although the obtained molecule-type OLED could be efficient and bright, its processing instrument investment is expensive. Also, it is not easy to fabricate large-area-scale molecule-type OLEDs in this manner. In contrast, an imprinting method can be used to prepare the molecule-type OLEDs with large-area-scale in an easy and low cost way, which the film uniformity and quality are sacrificed in stead.

Therefore, it is demanding to provide an OLED and a method for fabricating the same, which should be focused on solving not only the low efficiency and the low brightness of OLEDs prepared by an imprinting process with polymer hosts, but also the poor film-forming problems of OLEDs prepared by an imprinting process with small-molecule hosts.

SUMMARY OF THE INVENTION

The object of the present invention is to provide a method for fabricating an organic light-emitting diode employing a mixed host through an imprinting process to obtain an OLED with high efficiency.

Another object of the present invention is to provide an organic light-emitting diode employing a mixed host, and the efficiency of the OLED can be greatly improved by using the mixed host.

To achieve the object, the method for fabricating an organic light-emitting diode employing a mixed host comprises the following steps: (A) providing a substrate with a first electrode formed thereon; (B) coating a mold with light-emitting layer materials, wherein the light-emitting layer materials comprise: mixed host, and dye molecule(s), and the dye molecule(s) can be consisted of light-emitting dye(s) or dye-function-group-composing material(s); (C) pressing the mold coated with the light-emitting layer materials onto the substrate to transfer the light-emitting layer materials to the first electrode of the substrate, to form a light-emitting layer; and (D) forming a second electrode over the light-emitting layer. In the method of the present invention, the mixed host used in the step (B) comprises: small molecule host(s) and doping host(s), and the doping host(s) can be composed of polymer host(s), oligomer host(s), or a mixture thereof, which can facilitate the following transferring process.

In addition, the present invention also provides organic light-emitting diodes employing a mixed host and comprising: a substrate with a first electrode formed thereon; a light-emitting layer laid over the first electrode, wherein the light-emitting layer comprises: mixed host, dye molecule(s) etc., the dye molecule(s) can be consisted of light-emitting dye(s) or dye-function-group-composing material(s); and a second electrode, laid over the light-emitting layer.

According to the OLEDs and the method for fabricating the same of the present invention, the employing of mixed host for imprinting process not only has the advantages of high speed, simple process, and low cost, but also solves the problems of imprinting conventional polymer-type and molecule-type OLEDs. More specifically, according to the OLEDs and the method for fabricating the same of the present invention, both the low efficiency and the low brightness of the imprinted polymer host devices and the poor film uniformity of the imprinted molecule host ones can be greatly improved due to employing the mixed host. In brief, the invented method for fabricating the OLEDs is simple and low-cost, and the obtained OLEDs show excellent light-emitting luminance.

According to the OLEDs and the method for fabricating the same of the present invention, the mixed host can comprise small molecule host(s) and doping host(s). The doping host(s) is composed of functional dopant(s), especially of polymer host(s), oligomer host(s), or a mixture thereof which can facilitate the film-transferring of the imprinting process. In addition, the mixed host not only can comprise the small molecule host(s) and the mentioned doping host(s), but also may further comprise other additives, such as a binder that used to improve the printability or a charge-carrier-transport promoter. The aforementioned polymer host is a material formed by the polymerization of repeated small-molecular monomers, and the molecular weight of the polymer host is about 10,000 g/mole or more. The small molecule host is a material composed of a single molecule, and the molecular weight of the small molecule host is about 1,000 g/mole or less. The oligomer host is a material composing, from several to few hundreds units, and the molecular weight of the oligomer host is about 1,000~10,000 g/mole.

According to the OLEDs and the method for fabricating the same of the present invention, the polymer host, the oligomer host, and the small molecule host can be any host generally used in the art. For example, the polymer host can be PVK, or other polymer hosts generally used; the oligomer host may be at least one selected from the group consisting of RS12, SL75, and the like; and the small molecule host is at least one selected from the group consisting of CEP, Spiro2CBP, BSB, SimCP, SimCP2, and the like.

According to the OLEDs and the method for fabricating the same of the present invention, the polymer host(s) and/or the oligomer host(s) (i.e. the doping host) can be mixed with the small molecule host(s) in any ratio. Preferably, the amount of the doping host(s) is 5-80 wt % based on the total weight of the small molecule host(s). More preferably, the amount of the doping host(s) is 25-60 wt % based on the total weight of the small molecule host(s). Most preferably, the amount of the doping host is 30-55 wt % based on the total weight of the small molecule host(s).

In addition, the method for fabricating the OLED of the present invention may further comprise a step (A1) after the step (A): coating a mold with a sacrificed layer (or an adhesion-promoting layer), and the step (B) is: coating the mold coated with the sacrificed layer (or the adhesion-promoting layer) with the light-emitting layer materials. After the mold coated with the sacrificed layer (or the adhesion-promoting layer) and the light-emitting layer is pressed onto the substrate, and then the light-emitting layer materials can be transferred onto the first electrode to form a light-emitting layer on the first electrode. Herein, the sacrificed layer materials can also be light-emitting materials generally used in the OLED. In addition, the materials for the sacrificed layer could be the same or different with the materials for light-emitting layer. Preferably, the sacrificed layer materials and the light-emitting layer materials are the same, i.e. both of the sacrificed layer materials and the light-emitting layer materials comprise: a mixed host, and dye molecule(s).

The method for fabricating the OLED of the present invention may further comprise a step (D') before the step (D): heat-treating the light-emitting layer to remove the residual solvent in the light-emitting layer. Hence, the efficiency of the OLED can be improved. In addition, after the step (C) or the step (D') is performed, a flat mold can be pressed on the light-emitting layer with a suitable pressure to ensure the surface smoothness of the imprinted light-emitting layer, if it is needed. Furthermore, the step (B) and the step (C) can be repeated several times after the step (C) is finished, to form plural light-emitting layers.

According to the method for fabricating the OLED of the present invention, the heat-treatment in the step (D') can be a baking process generally used in the art. The temperature of the baking process is 30-200° C.; and the performing time is not particularly limited, and can be several seconds to several hours.

In addition, according to the method for fabricating the OLED of the present invention, the mold can be coated with the light-emitting layer material or the sacrificed layer material through a spin coating process, a dip coating process, a roll coating process, or a printing process.

According to the method for fabricating the OLED of the present invention, the material of the mold can be any mold material generally used in the imprinting process. Preferably, the material of mold is poly(dimethyl siloxane) (PDMS). The surface free energy of the PDMS mold is extremely low, so it can transfer the inked light-emitting materials to the substrate easily, when it pressed onto the substrate. In addition, the mold can be preferably treated with oxygen plasma to modify the surface energy, before the mold is coated with the organic material ink.

Furthermore, the method for fabricating the OLED of the present invention may further comprise a step (A2) after the step (A): forming a hole-transport layer over the first electrode, forming a hole-injection layer over the first electrode, or sequentially forming a hole-injection layer and a hole-transport layer over the first electrode. Hence, the light-emitting diode of the present invention may further comprise: a hole-transport layer deposited between the first electrode and the light-emitting layer; a hole-injection layer deposited between the first electrode and the light-emitting layer; or a hole-injection layer and a hole-transport layer sequentially laminated on the first electrode and deposited between the first electrode and the light-emitting layer.

In addition, the method for fabricating the OLED of the present invention may further comprise a step (C1) after the step (C): forming an electron-transport layer over the light-emitting layer, forming an electron-injection layer over the light-emitting layer, or sequentially forming an electron-transport layer and an electron-injection layer over the light-emitting layer. Hence, the light-emitting diode of the present invention may further comprise: an electron-transport layer deposited between the light-emitting layer and the second electrode; an electron-injection layer deposited between the light-emitting layer and the second electrode; or an electron-transport layer and an electron-injection layer sequentially laminated on the light-emitting layer and deposited between the light-emitting layer and the second electrode.

According to the OLEDs and the method for fabricating the same of the present invention, the dye molecule(s) can be all kinds light-emitting materials generally used in the art, such as fluorescence materials and phosphorescence materials. The examples of the light-emitting materials emitting green light can be: BNE, Alq, DPT, $Alq_3$, $Bebq_2$, DMQA, Coumarin 6, Q, NMQ, Quinacrine, etc.; the examples of the light-emitting materials emitting red light can be: DCM-2, TMS-SiPc, DCJTB, Rubrene, (piq)2Ir(acac), ER53, ABTX, etc.; and the examples of the light-emitting materials emitting blue light can be: TPAN, DPAN, DPAP, Perylene ($C_{20}H_{12}$), DPVBi, PPD, α-NPD2, β-NPD, TTBND, DCTA, DPASN, DPVP, DPVP2, MDP3FL, BANE, TDAPTz, etc.

In addition, according to the OLEDs and the method for fabricating the same of the present invention, the material of the hole-transport layer is not particularly limited, and can be an aromatic tertiary amine with at least one $N^{3+}$ bonding to C, and at least one aromatic ring. Preferably, the aromatic tertiary amine is arylamine, such as monarylamine, diarylamine, or triaraylamine. In addition, the material of the electron-transport layer is also not particularly limited, and can be a metal chelated oxinoid compound, or an oxine chelate, such as $Alq_3$.

According to the OLEDs and the method for fabricating the same of the present invention, the substrate may be a silicon substrate, a glass substrate, a quartz substrate, a plastic substrate, or other available substrates. In addition, the anode can be any suitable transparent or opaque conductive layer, such as ITO.

DETAILED DESCRIPTION OF THE PREFERRED EMBODIMENT

Hereinbelow, the present invention will be described in detail with reference to the embodiments. The present invention may, however, be embodied in many different forms and should not be construed as being limited to the embodiments set forth herein. Rather, these embodiments are provided to fully convey the concept of the invention to those skilled in the art.

Embodiment 1

Figure 1:
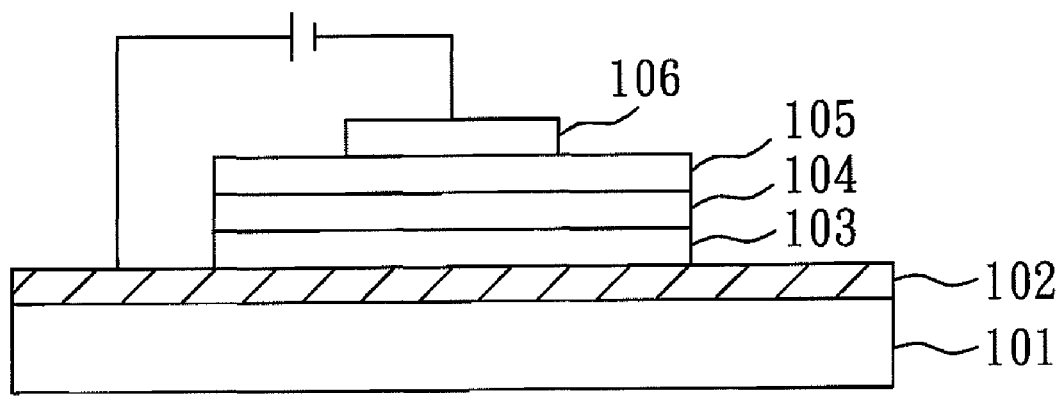
FIG. 1 is a perspective view of a conventional OLED.
Figure 2A:
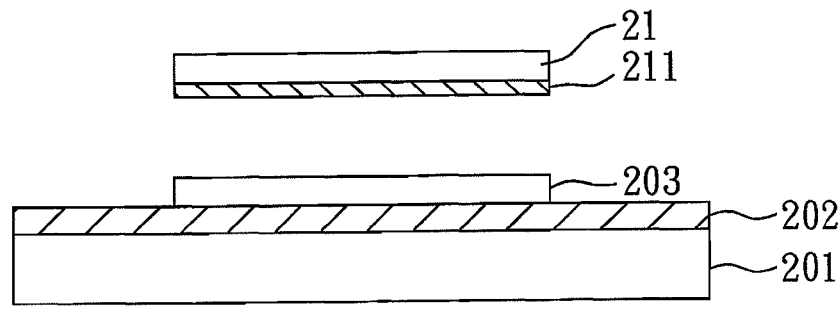
FIGS. 2A-2E are schematic process flow for preparing an OLED in a preferred embodiment of the present invention.

First, a substrate 201 was provided, and a first electrode 202 was formed thereon, as shown in FIG. 2A. Herein, the substrate 201 was a glass substrate, and the first electrode 202 was an ITO electrode.

Next, a PEDOT:PSS solution was coated on the first electrode 202 through a spin coating process to form a hole-transport/injection layer 203, as shown in FIG. 2A. Herein, the PEDOT solution was 7 mg/ml PEDOT:PSS in toluene/isopropanol (volume ratio=4:1), and the thickness of the hole-transport/injection layer 203 was 20-80 nm.

Then, a mold 21 was provided, and coated with a sacrificed layer material 211 through a spin coating process. Herein, the mold 21 was made of PDMS, and the surface of the mold 21 was treated with oxygen plasma before the spin coating process. Furthermore, the sacrificed layer material 211 used here comprised: $Ir(2-phq)_3$, PVK (a polymer host), and CBP (a small molecule host), and the content of PVK was 10 wt % based on the total weight of CBP.

Figure 2B:
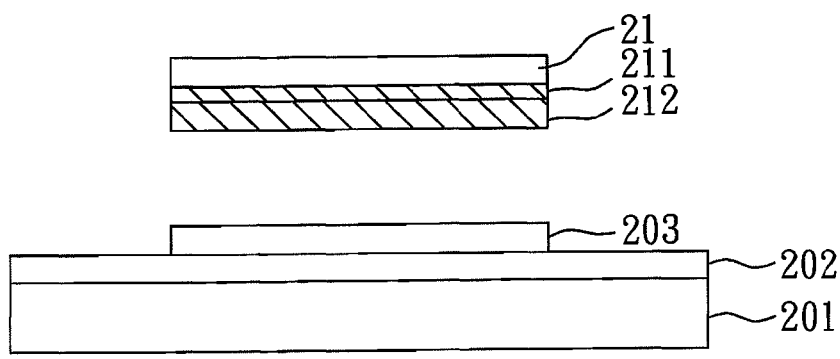

As shown in FIG. 2B, the sacrificed layer material 211 coated mold 21 was coated with a light-emitting layer material 212 through a spin coating process. Herein, the composition of the light-emitting layer material 212 was the same as that of the sacrificed layer material 211.

Figure 2C:
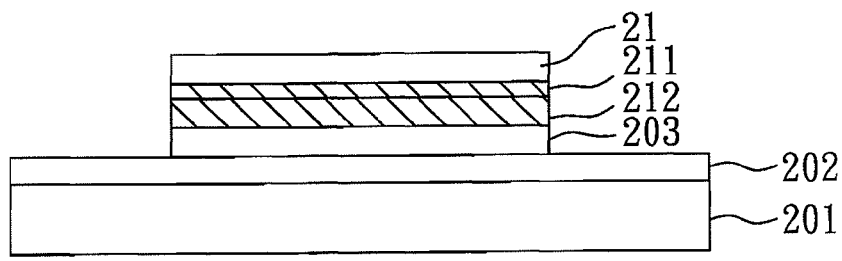
Figure 2D:
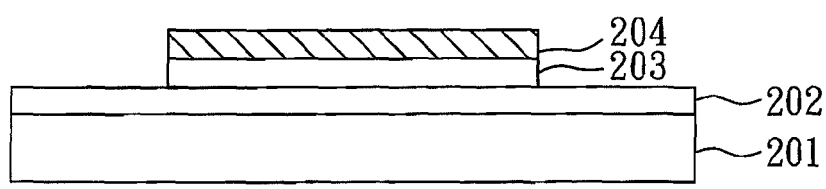

As shown in FIG. 2C, the mold 21 coated with the sacrificed layer material 211 and the light-emitting layer material 212 was pressed on the substrate 201, to transfer the sacrificed layer material 211 and the light-emitting layer material 212 onto the first electrode 202 with the hole-transport/injection layer 203 formed thereon. Therefore, a light-emitting layer 204 was formed over the first electrode 202 with the hole-transport/injection layer 203, as shown in FIG. 2D. In the present embodiment, the thickness of the light-emitting layer 204 was 1-100 nm.

Then, the substrate 201 with the light-emitting layer 204 formed thereon was placed into an oven at 110° C. for 10 min. A flat mold (not shown in the figure) was pressed on the light-emitting layer 204 to ensure the flatness of the light-emitting layer 204.

Figure 2E:
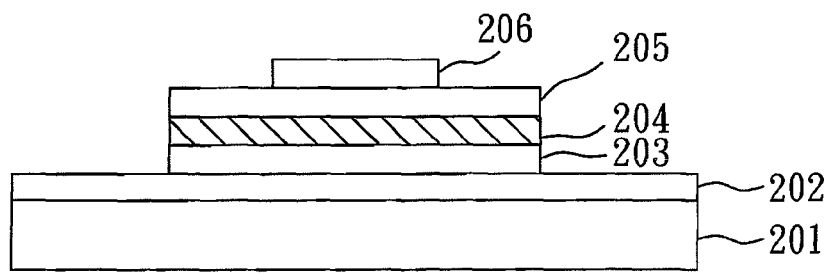

As shown in FIG. 2E, an electron injection/transport layer 205 was coated on the light-emitting layer 204, and followed by a second electrode 206 through an evaporation process to obtain an OLED emitting red light of the present embodiment. In the present embodiment, the material of the electron injection/transport layer 205 was TPBi and LiF, the second electrode 206 was an Al electrode, and the thickness of the electron injection/transport layer 205 was 5-80 nm.

After the aforementioned process, the OLED employing a mixed host of the present embodiment, as shown in FIG. 2E, comprises: a substrate 201 with a first electrode 202 formed thereon; a light-emitting layer 204 laid over the first electrode 202, wherein the light-emitting layer 204 comprises: a mixed host containing a small molecule host (CBP) and a polymer host (PVK), and at least one dye molecule ($Ir(2-phq)_3$); and a second electrode 206, deposited on the light-emitting layer 204.

Embodiment 2

The OLED and the method for fabricating it of the present embodiment is the same as that of the Embodiment 1, except the content of PVK is 30 wt % based on the total weight of CBP.

Embodiment 3

The OLED and the method for fabricating it of the present embodiment is the same as that of the Embodiment 1, except the content of PVK is 40 wt % based on the total weight of CBP.

Embodiment 4

The OLED and the method for fabricating it of the present embodiment is the same as that of the Embodiment 1, except the content of PVK is 60 wt % based on the total weight of CBP.

Embodiment 5

The OLED and the method for fabricating it of the present embodiment is the same as that of the Embodiment 1, except the sacrificed layer and the light-emitting layer are consisting of $Ir(2-phq)_3$ (a red dye molecule), Firpic (a blue dye molecule), $Ir(ppy)_3$ (a green dye molecule), PVK (a polymer host), CBP (a small molecule host). Moreover, the content of PVK is 20-75 wt % based on the total weight of CBP for the present embodiment. Therefore, an OLED emitting white light is obtained in the present embodiment.

Embodiment 6

The OLED and the method for fabricating the same of the present embodiment is the same as that of the Embodiment 1, except the sacrificed layer and the light-emitting layer are comprising of Firpic (a blue dye molecule), PVK (a polymer host), CBP (a small molecule host). Moreover, the content of PVK is 20-75 wt % based on the total weight of CBP. Therefore, an OLED emitting blue light is obtained in the present embodiment.

Embodiment 7

The OLED and the method for fabricating the same of the present embodiment is the same as that of the Embodiment 1, except the sacrificed layer and the light-emitting layer are comprising of $Ir(ppy)_3$ (a green dye molecule), PVK (a polymer host), CBP (a small molecule host). Moreover, the content of PVK is 20-75 wt % based on the total weight of CBP. Therefore, an OLED emitting green light is obtained in the present embodiment.

Comparative Embodiment 1

The OLED and the method for fabricating the same of the present embodiment is the same as that of the Embodiment 1, except the sacrificed layer and the light-emitting layer are comprising of $Ir(2-phq)_3$, and CBP (a small molecule host only device).

Comparative Embodiment 2

The OLED and the method for fabricating the same of the present embodiment is the same as that of the Embodiment 1, except the sacrificed layer and the light-emitting layer are comprising of $Ir(2-phq)_3$, and PVK (a polymer host only device).

Testing Example

Figure 3:
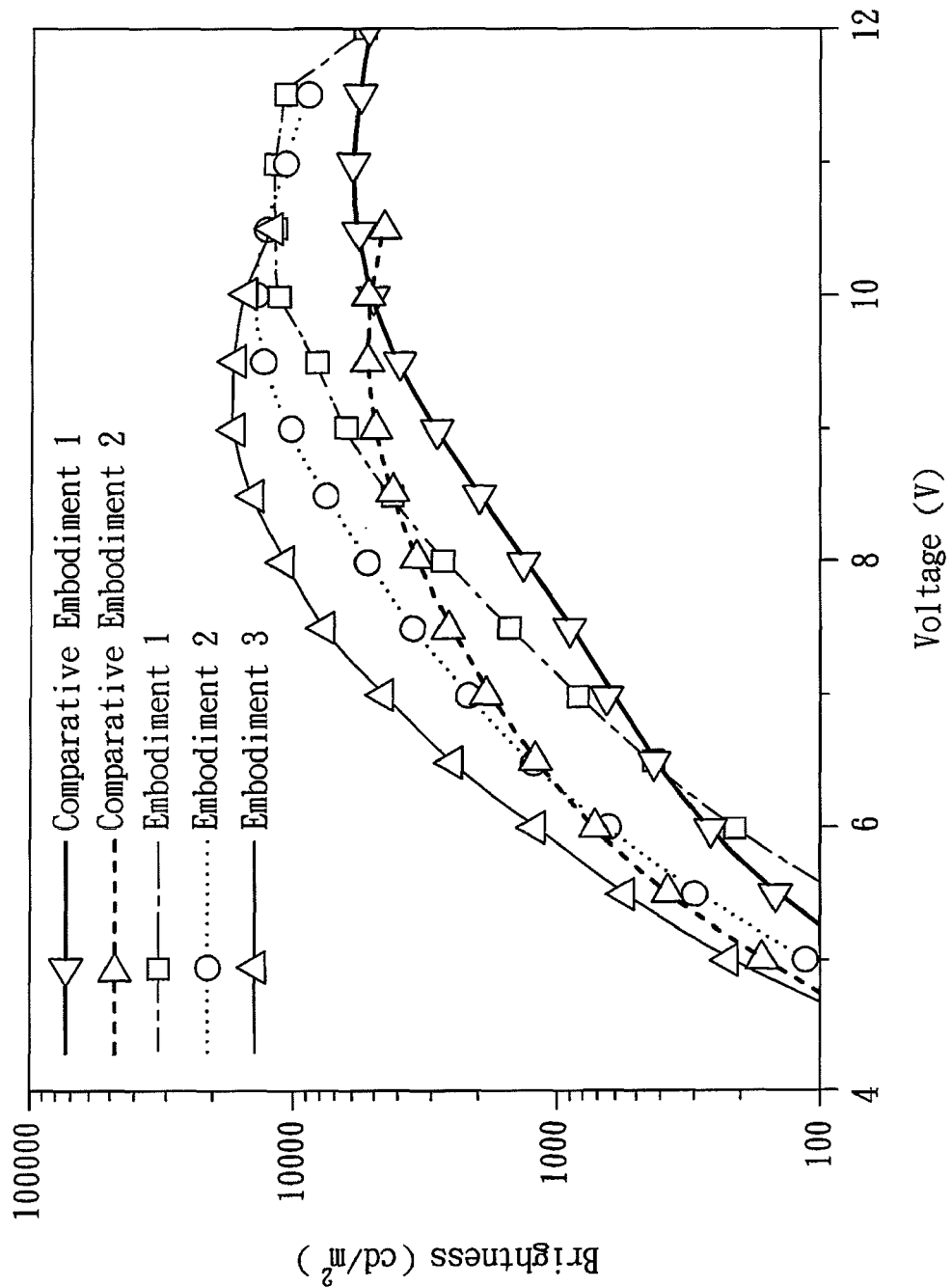
FIG. 3 is the comparisons of resultant brightness of the OLEDs according to the Embodiments 1-3 and the Comparative Embodiments 1-2 of the present invention.

FIG. 3 is the comparisons of resultant brightness of the OLEDs according to the Embodiments 1-3 and the Comparative Embodiments 1-2.

As shown in FIG. 3, the maximum brightness of the OLEDs employing a single host of the Comparative Embodiments 1-2 are only 5000 $cd/m^2$ and 6000 $cd/m^2$, respectively. However, the maximum brightness of the OLEDs employing a mixed host of the Embodiments 1-3 is greatly enhanced. Especially, the maximum brightness of the OLED of the Embodiment 3, which contains 40 wt % of PVK based on the total weight of CBP, is about 11000 $cd/m^2$.

Figure 4:
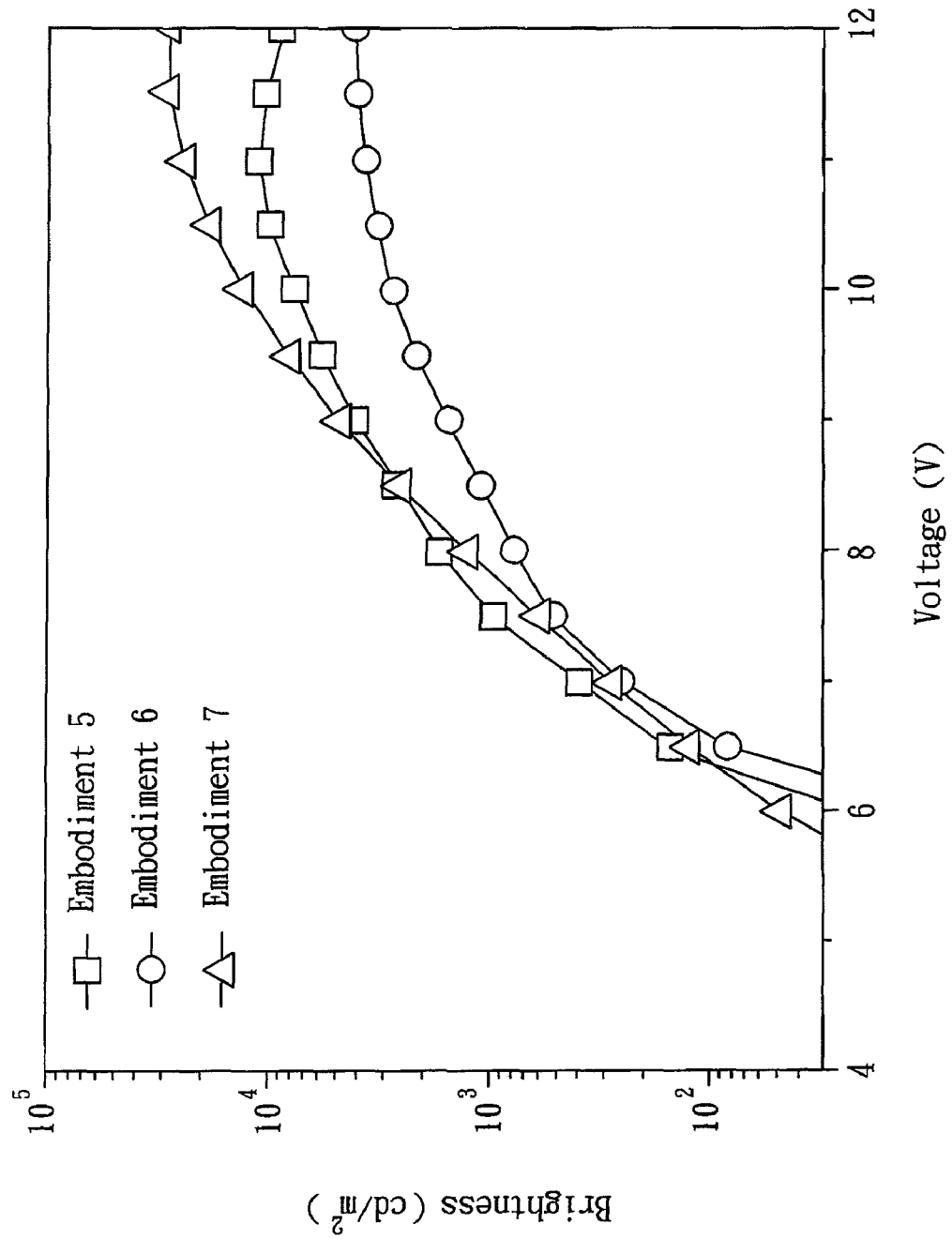
FIG. 4 is the comparisons of resultant brightness of the OLEDs according to the Embodiments 5-7 of the present invention.

In addition, FIG. 4 is the comparisons of resultant brightness of the OLEDs according to the Embodiments 5-7.

As shown in FIG. 4, it is possible to prepare OLEDs emitting light with various colors and high brightness by use of a mixed host containing a polymer host and a small molecule host.

In conclusion, according to the OLEDs and the method for fabricating the same of the present invention, the low efficiency and the low brightness of the device obtained by imprinting a polymer, and the poor film uniformity of the device obtained by imprinting small molecules can be greatly improved, due to employing the mixed host. In addition, the OLEDs and the method of the present invention can not only solve the processing difficulties on imprinting OLEDs, but also obtain OLEDs with excellent light-emitting efficiency. Therefore, it is possible to prepare an OLED with excellent light-emitting efficiency in a rapid and low-cost way by using the method of fabricating the OLED of the present invention.

Although the present invention has been explained in relation to its preferred embodiments, it is to be understood that many other possible modifications and variations can be made without departing from the scope of the invention as hereinafter claimed.

What is claimed is:

1. A method for fabricating an organic light-emitting diode employing a mixed host, comprising the following steps:
   (A) providing a substrate with a first electrode formed thereon;
   (B) coating a mold with at least one light-emitting layer material, wherein the light-emitting layer material comprises: a mixed host, and a dye molecule, the dye molecule is a light-emitting dye or a dye-function-group-composing material, the mixed host comprises a small molecule host and a doping host, the doping host is a polymer host, an oligomer host, or a mixture thereof, the molecular weight of the small molecule host is 1,000 g/mole or less, the molecular weight of the polymer host is 10,000 g/mole or more, and the molecular weight of the oligomer host is 1,000~10,000 g/mole;
   (C) pressing the mold coated with the light-emitting layer material onto the substrate to transfer the light-emitting layer material to the first electrode of the substrate, to form a light-emitting layer; and
   (D) forming a second electrode over the light-emitting layer.

2. The method as claimed in claim 1, wherein the polymer host is at least one selected from the group consisting of PVK, and the like.

3. The method as claimed in claim 1, wherein the oligomer host is at least one selected from the group consisting of RS12, SL75, and the like.

4. The method as claimed in claim 1, wherein the small molecule host is at least one selected from the group consisting of CBP, Spiro2CBP, BSB, SimCP, SimCP2, and the like.

5. The method as claimed in claim 1, wherein the amount of the doping host is 5-80 wt % based on the total weight of the small molecule host.

6. The method as claimed in claim 1, wherein the amount of the doping host is 25-60 wt % based on the total weight of the small molecule host.

7. The method as claimed in claim 1, wherein the amount of the doping host is 30-55 wt % based on the total weight of the small molecule host.

8. The method as claimed in claim 1, further comprising a step (D') before the step (D): heat-treating the light-emitting layer.

9. The method as claimed in claim 1, further comprising a step (A1) after the step (A): coating a mold with a sacrificed layer material, wherein the step (B) is: coating the mold coated with the sacrificed layer material with the light-emitting layer material.

10. The method as claimed in claim 9, wherein the material of the sacrificed layer material is the same as that of the light-emitting layer material.

11. The method as claimed in claim 1, further comprising a step (A2) after the step (A): forming a hole-transport layer over the first electrode, forming a hole-injection layer over the first electrode, or sequentially forming a hole-injection layer and a hole-transport layer over the first electrode.

12. The method as claimed in claim 1, further comprising a step (C1) after the step (C): forming an electron-transport layer over the light-emitting layer, forming an electron-injection layer over the light-emitting layer, or sequentially forming an electron-transport layer and an electron-injection layer over the light-emitting layer.

13. A light-emitting diode employing a mixed host, comprising:
   a substrate with a first electrode formed thereon;
   a light-emitting layer deposited on the first electrode, wherein the light-emitting layer comprises: mixed host, and dye molecule, the dye molecule is a light-emitting dye or a dye-function-group-composing material, the mixed host comprises a small molecule host and a doping host, the doping host is a polymer host, an oligomer host, or a mixture thereof, the molecular weight of the small molecule host is 1,000 g/mole or less, the molecular weight of the polymer host is 10,000 g/mole or more, and the molecular weight of the oligomer host is 1,000~10,000 g/mole; and
   a second electrode, deposited on the light-emitting layer.

14. The light-emitting diode as claimed in claim 13, wherein the polymer host is at least one selected from the group consisting of PVK, and the like.

15. The light-emitting diode as claimed in claim 13, wherein the oligomer host is at least one selected from the group consisting of RS12, SL75, and the like.

16. The light-emitting diode as claimed in claim 13, wherein the small molecule host is at least one selected from the group consisting of CBP, Spiro2CBP, BSB, SimCP, SimCP2, and the like.

17. The light-emitting diode as claimed in claim 13, wherein the amount of the doping host is 5-80 wt % based on the total weight of the small molecule host.

18. The light-emitting diode as claimed in claim 13, wherein the amount of the doping host is 25-60 wt % based on the total weight of the small molecule host.

19. The light-emitting diode as claimed in claim 13, wherein the amount of the doping host is 30-55 wt % based on the total weight of the small molecule host.

20. The light-emitting diode as claimed in claim 13, further comprising: a hole-transport layer deposited between the first electrode and the light-emitting layer; a hole-injection layer deposited between the first electrode and the light-emitting layer; or a hole-transport layer and a hole-injection layer sequentially laminated on the first electrode and deposited between the first electrode and the light-emitting layer.

21. The light-emitting diode as claimed in claim 13, further comprising: an electron-transport layer deposited between the light-emitting layer and the second electrode; an electron-injection layer deposited between the light-emitting layer and the second electrode; or an electron-transport layer and an electron-injection layer sequentially laminated on the light-emitting layer and deposited between the light-emitting layer and the second electrode.

* * * * *